(12) United States Patent
Yao et al.

(10) Patent No.: US 8,603,924 B2
(45) Date of Patent: Dec. 10, 2013

(54) METHODS OF FORMING GATE DIELECTRIC MATERIAL

(75) Inventors: Liang-Gi Yao, Shin Chu (TW); Chia-Cheng Chen, Hsinchu (TW); Clement Hsingjen Wann, Carmel, NY (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/004,309

(22) Filed: Jan. 11, 2011

(65) Prior Publication Data

US 2012/0094504 A1  Apr. 19, 2012

Related U.S. Application Data

(60) Provisional application No. 61/394,418, filed on Oct. 19, 2010.

(51) Int. Cl.
 *H01L 21/31* (2006.01)
 *H01L 21/469* (2006.01)

(52) U.S. Cl.
 USPC .............................. 438/787; 438/763; 438/766

(58) Field of Classification Search
 USPC .................. 438/763, 287, 591, 303, 766, 787
 See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 5,767,732 A | 6/1998 | Lee et al. | |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,713,365 B2 | 3/2004 | Lin et al. | |
| 6,727,557 B2 | 4/2004 | Takao | |

(Continued)

FOREIGN PATENT DOCUMENTS

| CN | 1945829 | 4/2004 |
|---|---|---|
| CN | 101179046 | 5/2005 |

(Continued)

OTHER PUBLICATIONS

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

(Continued)

*Primary Examiner* — Walter H Swanson
*Assistant Examiner* — Wilner Jean Baptiste
(74) *Attorney, Agent, or Firm* — Lowe Hauptman & Ham, LLP

(57) ABSTRACT

A method of forming gate dielectric material includes forming a silicon oxide gate layer over a substrate. The silicon oxide gate layer is treated with a first ozone-containing gas. After treating the silicon oxide gate layer, a high dielectric constant (high-k) gate dielectric layer is formed over the treated silicon oxide gate layer.

21 Claims, 12 Drawing Sheets

(56) References Cited

U.S. PATENT DOCUMENTS

| | | |
|---|---|---|
| 6,740,247 B1 | 5/2004 | Han et al. |
| 6,743,673 B2 | 6/2004 | Watanabe et al. |
| 6,762,448 B1 | 7/2004 | Lin et al. |
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,905,953 B2 * | 6/2005 | Lindgren ............ 438/612 |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,297,600 B2 | 11/2007 | Oh et al. |
| 7,298,600 B2 | 11/2007 | Takikawa et al. |
| 7,300,837 B2 | 11/2007 | Chen et al. |
| 7,312,164 B2 * | 12/2007 | Lindgren ............ 438/782 |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,759,228 B2 | 7/2010 | Sugiyama et al. |
| 7,795,097 B2 | 9/2010 | Pas |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,321 B2 | 4/2011 | Lai et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2003/0080361 A1 | 5/2003 | Murthy et al. |
| 2003/0109086 A1 * | 6/2003 | Arao ............ 438/149 |
| 2003/0234422 A1 | 12/2003 | Wang et al. |
| 2004/0075121 A1 | 4/2004 | Yu et al. |
| 2004/0129998 A1 | 7/2004 | Inoh et al. |
| 2004/0192067 A1 | 9/2004 | Ghyselen et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0051865 A1 | 3/2005 | Lee et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0233598 A1 * | 10/2005 | Jung et al. ............ 438/785 |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 * | 6/2006 | Arikado et al. ............ 257/411 |
| 2006/0151808 A1 | 7/2006 | Chen et al. |
| 2006/0153995 A1 * | 7/2006 | Narwankar et al. ............ 427/569 |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0004218 A1 * | 1/2007 | Lee et al. ............ 438/756 |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 * | 8/2007 | Jung et al. ............ 438/216 |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 * | 2/2008 | Bevan et al. ............ 438/308 |
| 2008/0085580 A1 | 4/2008 | Doyle et al. |
| 2008/0085590 A1 | 4/2008 | Yao et al. |
| 2008/0095954 A1 * | 4/2008 | Gabelnick et al. ............ 427/579 |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |

(56) References Cited

U.S. PATENT DOCUMENTS

| | | | |
|---|---|---|---|
| 2010/0207211 A1 | 8/2010 | Sasaki et al. | |
| 2010/0308379 A1 | 12/2010 | Kuan et al. | |
| 2011/0018065 A1 | 1/2011 | Curatola et al. | |
| 2011/0108920 A1 | 5/2011 | Basker et al. | |
| 2011/0129990 A1 | 6/2011 | Mandrekar et al. | |
| 2011/0195555 A1 | 8/2011 | Tsai et al. | |
| 2011/0195570 A1 | 8/2011 | Lin et al. | |
| 2011/0256682 A1* | 10/2011 | Yu et al. | 438/287 |
| 2012/0086053 A1 | 4/2012 | Tseng et al. | |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Office Action dated May 2, 2012 from corresponding application No. CN 201010196345.0.

Office Action dated May 4, 2012 from corresponding application No. CN 201010243667.6.

\* cited by examiner

| | PRE-HK CLEAN | CET @ Vfb ~1V (Å) | 1-SIGMA | CET (%) | Jg @ Vfb ~1V (A/cm²) | 1-SIGMA | Jg (%) |
|---|---|---|---|---|---|---|---|
| SAMPLE A | SC1 | 1.22 | 0.01 | -- | 0.84 | 0.05 | -- |
| SAMPLE B | TREATMENT WITH OZONE-CONTAINING GAS ~ 10 SECONDS | 1.24 | 0.01 | 1.99 | 0.41 | 0.01 | -50.93 |
| SAMPLE C | TREATMENT WITH OZONE-CONTAINING GAS ~ 20 SECONDS | 1.24 | 0 | 2.21 | 0.32 | 0.02 | -61.73 |
| SAMPLE D | TREATMENT WITH OZONE-CONTAINING GAS ~ 30 SECONDS | 1.24 | 0.02 | 1.55 | 0.30 | 0.03 | -63.88 |

METHODS OF FORMING GATE DIELECTRIC MATERIAL

CROSS-REFERENCES TO RELATED APPLICATIONS

The present application claims priority of U.S. Application Ser. No. 61/394,418, filed on Oct. 19, 2010.

The present application is related to U.S. patent application Ser. Nos. 12/687,574, filed on Jan. 14, 2010, titled METHODS AND APPARATUS OF FLUORINE PASSIVATION; Ser. No. 12/789,681, filed on May 28, 2010, titled SCALING EOT BY ELIMINATING INTERFACIAL LAYERS FROM HIGH-K/METAL GATES OF MOS DEVICES; Ser. No. 12/707,788, filed on Feb. 18, 2010, titled MEMORY POWER GATING CIRCUIT AND METHODS; Ser. No. 12/892,254, filed Sep. 28, 2010, titled METHODS OF FORMING INTEGRATED CIRCUITS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES; which are incorporated herein by reference in their entireties

TECHNICAL FIELD

The present disclosure relates generally to the field of semiconductor devices, and more particularly, to methods of forming gate dielectric material.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIG. 5 is a table showing capacitance effective thickness (CET), gate leakage current, and uniformities of samples A-D.

DETAILED DESCRIPTION

Figure 1:
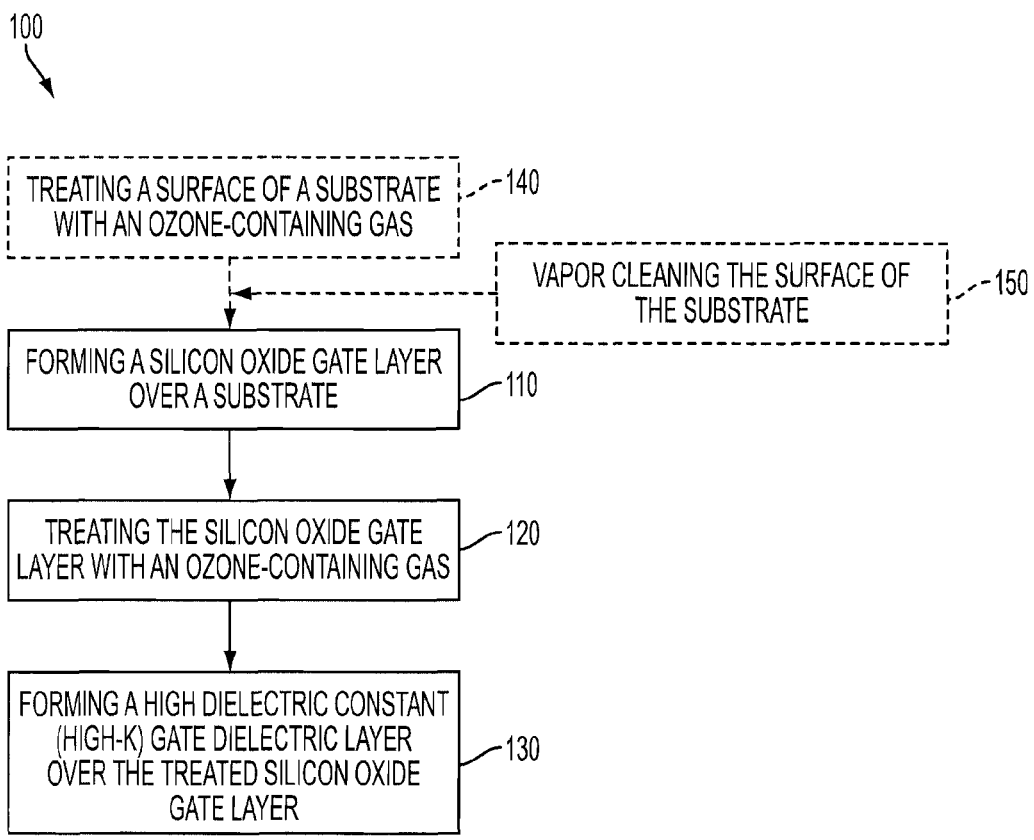
FIG. 1 is a flowchart of an exemplary method of forming gate dielectric material.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

Standard cleaning 1 (SC1) process has been proposed to clean an oxide interfacial layer before formation of a high dielectric constant (high-k) dielectric material. It is found that the SC1 process may damage and/or roughen the surface of the oxide interfacial layer. The damaged and/or roughened oxide interfacial layer may adversely affect the formation of the subsequent high-k dielectric material formed thereon. The damaged and/or roughened oxide interfacial layer may deteriorate the gate leakage current of the transistor formed on the substrate.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flowchart of an exemplary method of forming gate dielectric material. FIGS. 2A-2H are schematic cross-sectional views of an integrated circuit during various fabrication stages. The integrated circuit may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, or other types of transistors. It is understood that FIGS. 2A-2H have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a silicon oxide gate layer over a substrate (block 110). The method 100 can include treating the silicon oxide gate layer with an ozone-containing gas (block 120). After treating the silicon oxide gate layer, the method 100 can include forming a high dielectric constant (high-k) gate dielectric layer over the treated silicon oxide gate layer (block 130). In some embodiments, the method 100 can optionally include treating a surface of the substrate with an ozone-containing gas (block 140). In other embodiments, the method 100 can optionally include vapor cleaning the surface of the substrate (block 150).

Figure 2A:
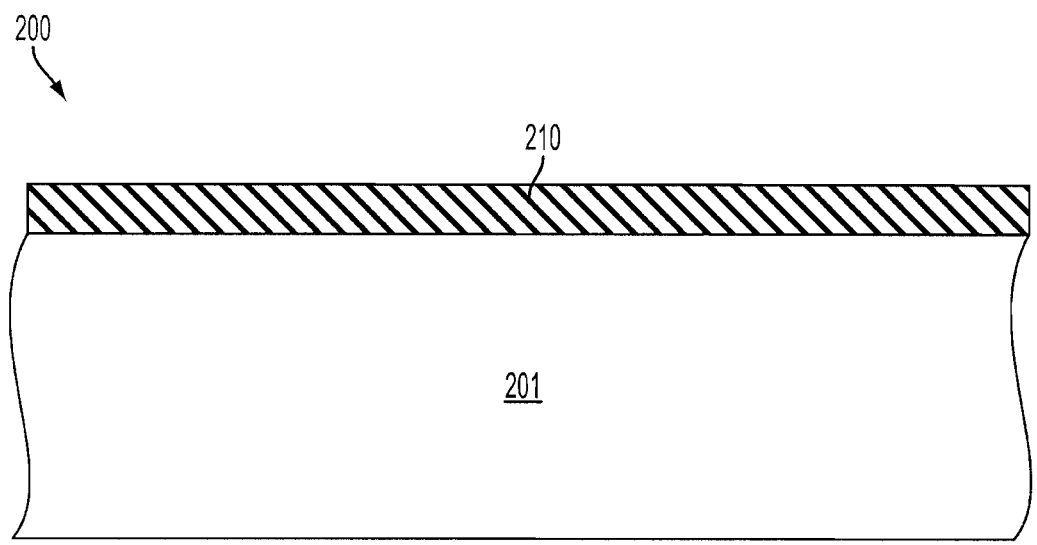
FIGS. 2A-2H are schematic cross-sectional views of an integrated circuit during various fabrication stages.

Referring now to FIGS. 2A-2H in conjunction with FIG. 1, an integrated circuit 200 can be fabricated in accordance with the method 100 of FIG. 1. In FIG. 2A, the integrated circuit 200 can have a substrate 201. The substrate 201 can be a silicon substrate doped with a P-type dopant, such as boron (a P-type substrate). Alternatively, the substrate 201 could be another suitable semiconductor material. For example, the substrate 201 may be a silicon substrate that is doped with an N-type dopant, such as phosphorous or arsenic (an N-type substrate). The substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

In some embodiments, shallow trench isolation (STI) features (not shown) may also be formed in the substrate 201. The STI features can be formed by etching recesses (or trenches) in the substrate 201 and filling the recesses with a dielectric material. In some embodiments, the dielectric material of the STI features includes silicon oxide. In alternative embodiments, the dielectric material of the STI features may include silicon nitride, silicon oxy-nitride, fluoride-doped silicate (FSG), and/or any suitable low-k dielectric material.

Referring to FIG. 1, the method 100 can include forming a silicon oxide gate layer over a substrate (block 110). For example, a silicon oxide gate layer 210 can be formed over on the substrate 201 as shown in FIG. 2A. In some embodiments, the silicon oxide gate layer 210 can be formed by a thermal process, e.g., a furnace process and/or a rapid oxidation process using an oxygen-containing precursor, e.g., oxygen ($O_2$) and/or ozone ($O_3$). For example, the silicon oxide gate layer 210 can be grown in an oxygen environment of about 700 degrees Celsius or more, and in another example of about 800 degrees Celsius or more. In other embodiments, the silicon oxide gate layer 210 can be formed by an enhanced in-situ steam generation (EISSG) process. In still other embodiments, the silicon oxide gate layer 210 can be formed by an atomic layer deposition (ALD) process.

In some embodiments, the silicon oxide gate layer 210 can have a thickness less than about 1 nanometer (nm), and in one embodiment, may be in a range from approximately 0.3 nm to approximately 1 nm. In other embodiments, the silicon oxide gate layer 210 can have a thickness more than about 1 nm. In some embodiments, the silicon oxide gate layer 210 can be referred to as a base layer. In other embodiments, the silicon oxide gate layer 210 can be referred to as an interfacial layer.

Figure 2B:
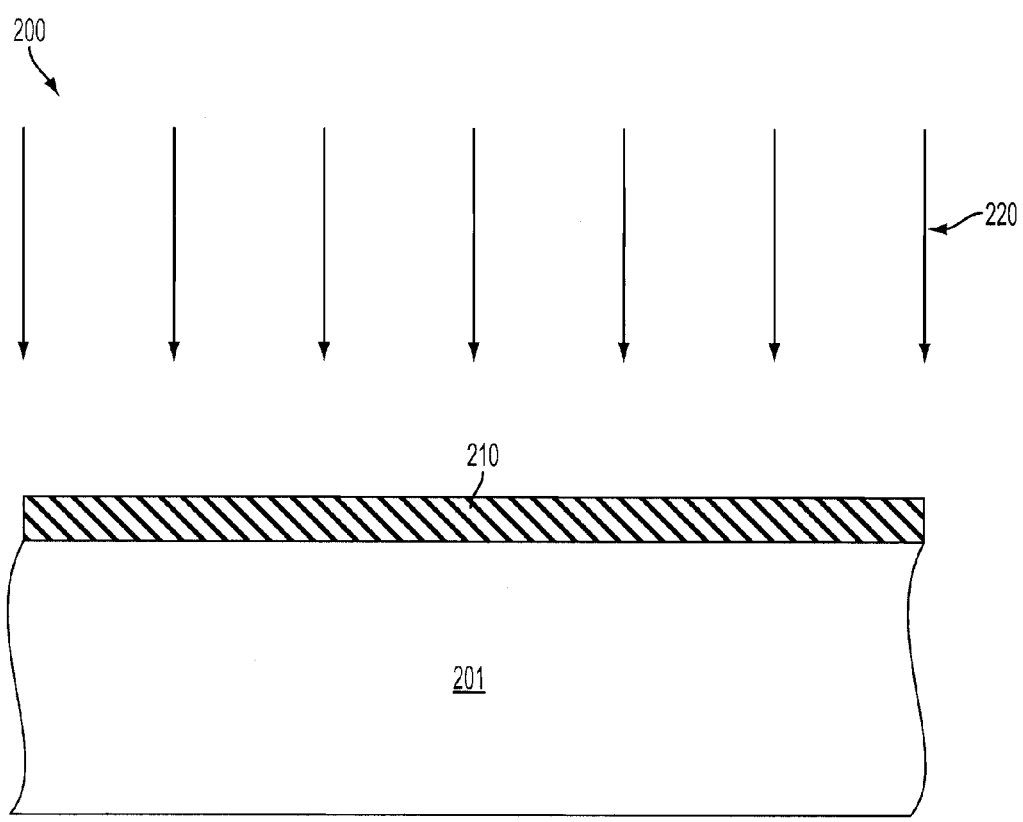

Referring to FIG. 1, the method 100 can include treating the silicon oxide gate layer with an ozone-containing gas (block 120). For example, the silicon oxide gate layer 210 can be treated with an ozone-containing gas 220 as shown in FIG. 2B. In some embodiments, the ozone-containing gas 220 can comprise ozone ($O_3$) and at least one carrier gas, e.g., nitrogen ($N_2$), helium (He), and/or other suitable carrier gases. The ozone can have a weight percentage ranging from about 1.35% to about 15.5%. In some embodiments, treating the silicon oxide gate layer 210 can have a processing time ranging from about 5 seconds to about 80 seconds. In other embodiments, the processing time can range from about 10 seconds to about 30 seconds.

Figure 3:
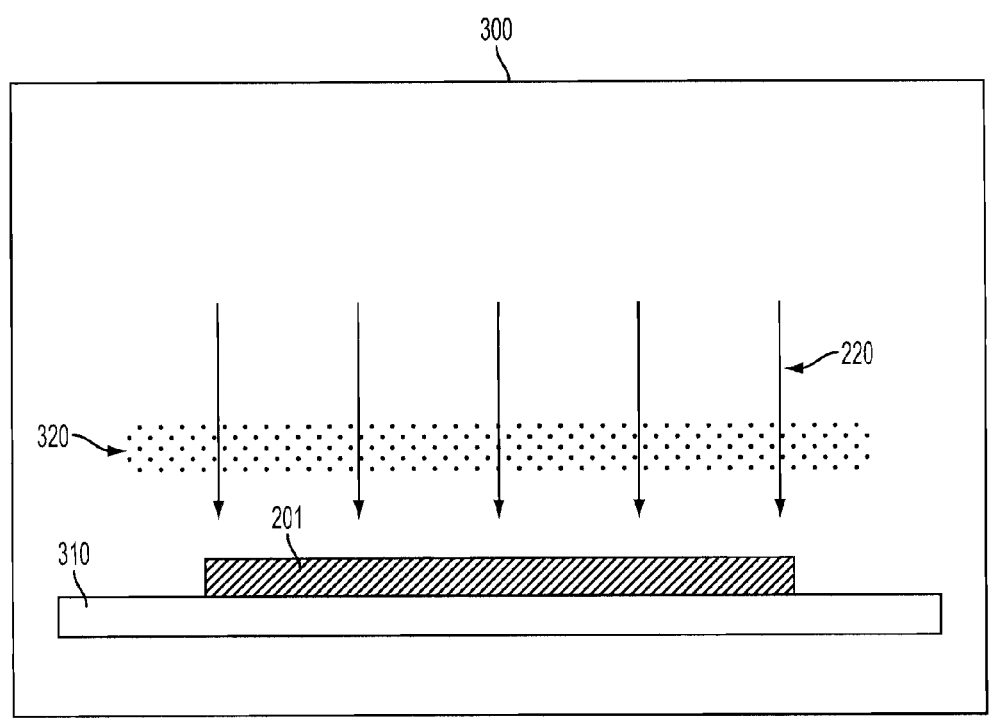
FIG. 3 is a schematic drawing illustrating an exemplary ozone-containing-gas treatment.

It is noted that treating the silicon oxide gate layer 210 can form a desired amount of hydroxyl (—OH) bonds on the surface of the silicon oxide gate layer 210. The hydroxyl bonds can help the subsequent formation of a high-k gate dielectric layer. In some embodiments, treating the silicon oxide gate layer 210 can be performed as shown in FIG. 3. In FIG. 3, the substrate 201 can be disposed over a stage 310 within a chamber 300. In some embodiments, treating the silicon oxide gate layer 210 can optionally include rotating the substrate 201.

In some embodiments, treating the silicon oxide gate layer 210 can include spreading a de-ionized (DI) water layer 320 over the silicon oxide gate layer 210. The ozone-containing gas 220 can diffuse through the water layer 320, such that the ozone-containing gas 220 can reach and treat the surface of the silicon oxide gate layer 210. Since the ozone-containing gas 220 diffuses through the water layer 320, the ozone in the ozone-containing gas 220 can have a supersaturating concentration for treating the silicon oxide gate layer 210. In some embodiments, treating the silicon oxide gate layer 210 may increase the thickness of the silicon oxide gate layer 210. In other embodiments, the increased thickness of the silicon oxide gate layer 210 can be about 10 Å or less.

Figure 2C:
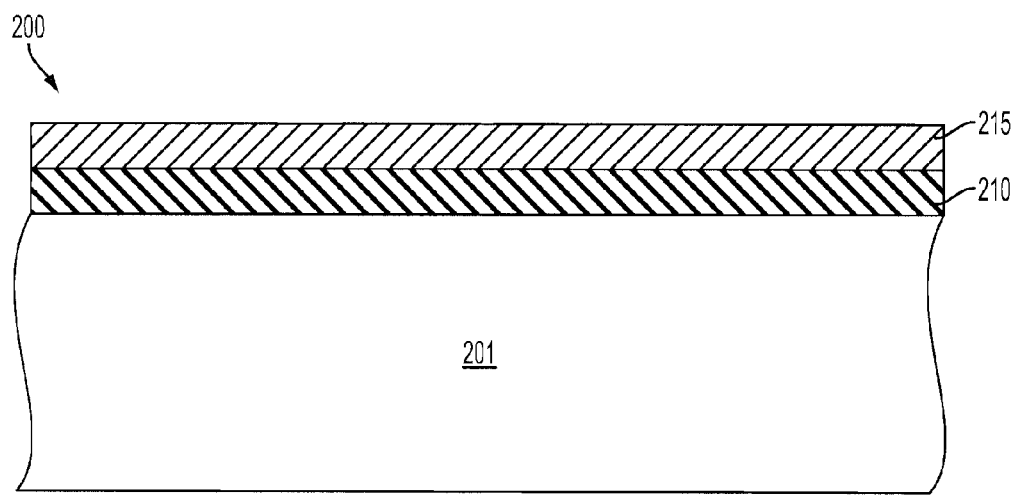

Referring again to FIG. 1, the method 100 can include forming a high dielectric constant (high-k) gate dielectric layer over the treated silicon oxide gate layer (block 130). For example, a high-k gate dielectric layer 215 can be formed over the treated silicon oxide gate layer 210, as shown in FIG. 2C. As noted, the hydroxyl groups on the surface of the treated silicon oxide gate layer 210 can help the formation of the high-k gate dielectric layer 215. The quality of the high-k gate dielectric layer 215 can be desirably achieved.

In one example, the high-k gate dielectric layer 215 is formed by an atomic layer deposition (ALD) process and includes a high-k dielectric material. A high-k dielectric material is a material having a dielectric constant that is greater than a dielectric constant of $SiO_2$, which is approximately 4. In an embodiment, the high-k gate dielectric layer 215 includes hafnium oxide ($HfO_2$), which has a dielectric constant that is in a range from approximately 18 to approximately 40. In alternative embodiments, the high-k gate dielectric layer 215 may include one of AlO, HfO, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfTiO, HfTaO, HfSiO, SrTiO, ZrSiON, HfZrTiO, HfZrSiON, HfZrLaO, HfZrAlO, and so on.

Figure 2D:
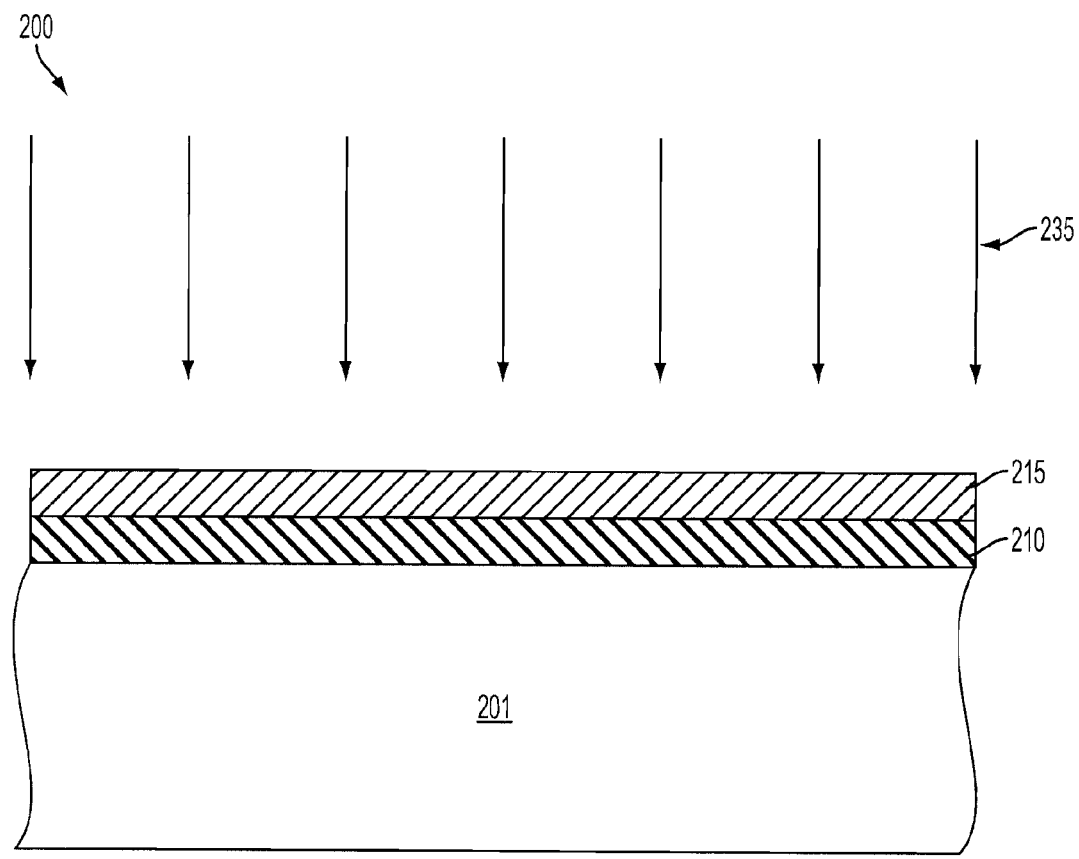

Referring to FIG. 2D, a process 235 can be optional to nitridize at least a portion of the silicon oxide gate layer 210 (shown in FIG. 2B) to form a silicon oxynitride layer (SiON) layer (not shown) between the high-k gate dielectric layer 215 and the silicon oxide gate layer 210. In some embodiments, the SiON layer can be formed by a decoupled plasma nitridization (DPN) process and/or other suitable nitridization processes.

Figure 2E:
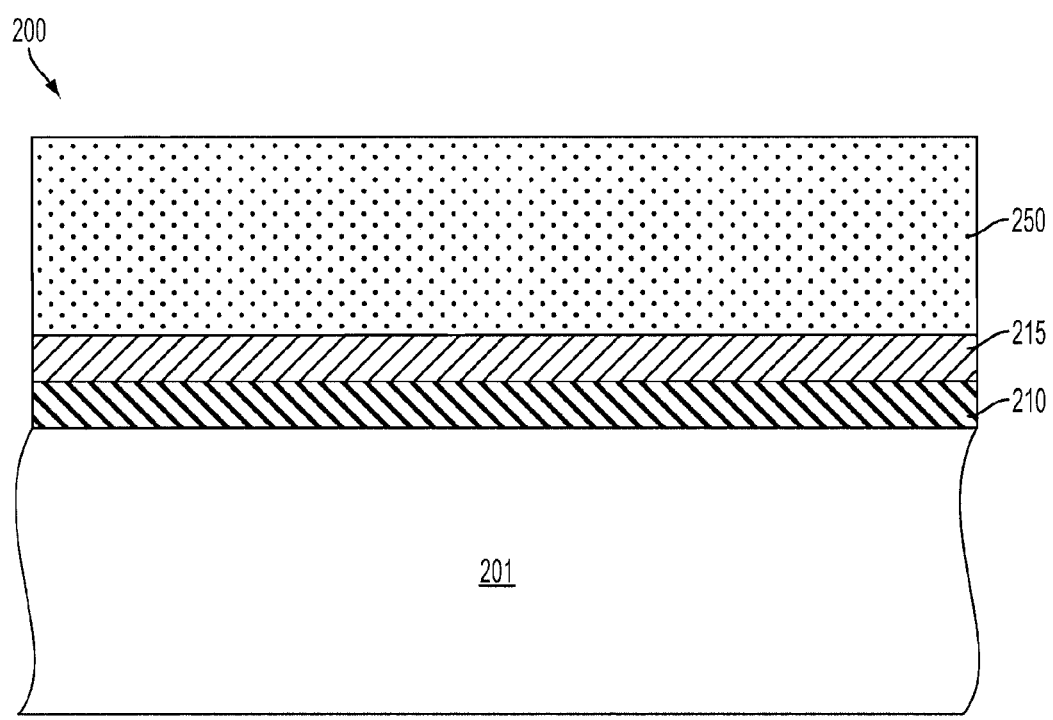

Referring now to FIG. 2E, a gate electrode layer 250 can be formed over the high-k gate dielectric layer 215. The gate electrode layer 250 may include silicon, polysilicon, and/or a metallic material, such as TiN, TaN, TaC, TaSiN, WN, TiAl, W, Al, Cu, or any combinations thereof. The metal gate electrode layer 250 may be formed by chemical vapor deposition (CVD), physical vapor deposition (PVD), or another suitable technique.

Figure 2F:
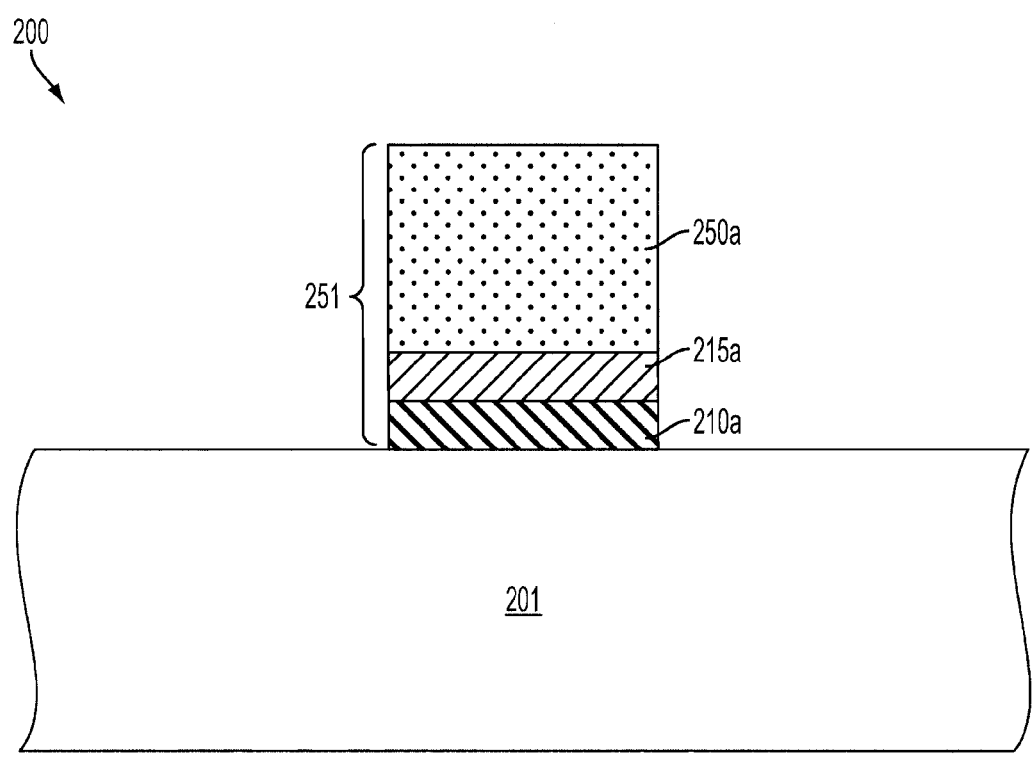

Referring to FIG. 2F, the silicon oxide gate layer 210, the high-k gate dielectric layer 215, and the gate electrode layer 250 (shown in FIG. 2E) can be patterned by using a photolithography process and an etch process to form a gate stack structure 251 including a silicon oxide gate layer 210a, a high-k gate dielectric layer 215a, and a gate electrode layer 250a. In some embodiments, the gate stack structure 251 can be formed in a gate-last process flow that can be referred to as a replacement gate process flow.

Figure 2G:
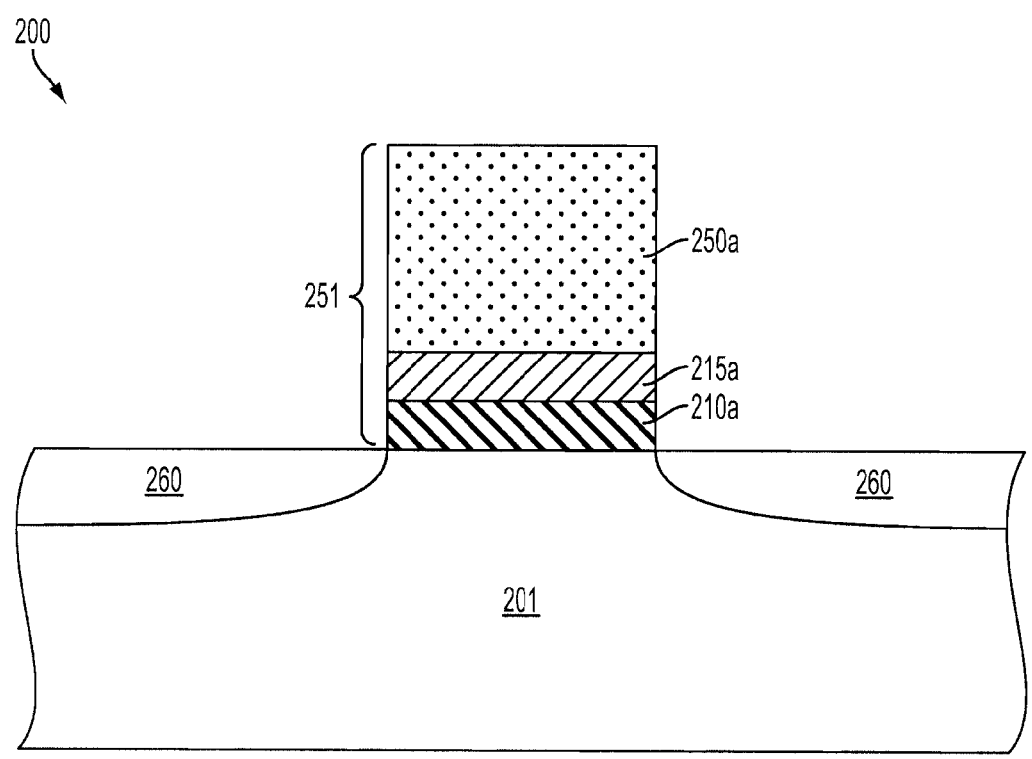

Referring to FIG. 2G, after the gate structure 251 is patterned, lightly doped source/drain (also referred to as LDD) regions 260 may be formed in portions of the substrate 201 on each side of the gate structure 251. The LDD regions 260 may be formed by an ion implantation process and/or a diffusion process. N-type dopants, such as phosphorus or arsenic, may be used to form an NMOS device, and P-type dopants, such as boron, may be used to form a PMOS device.

Figure 2H:
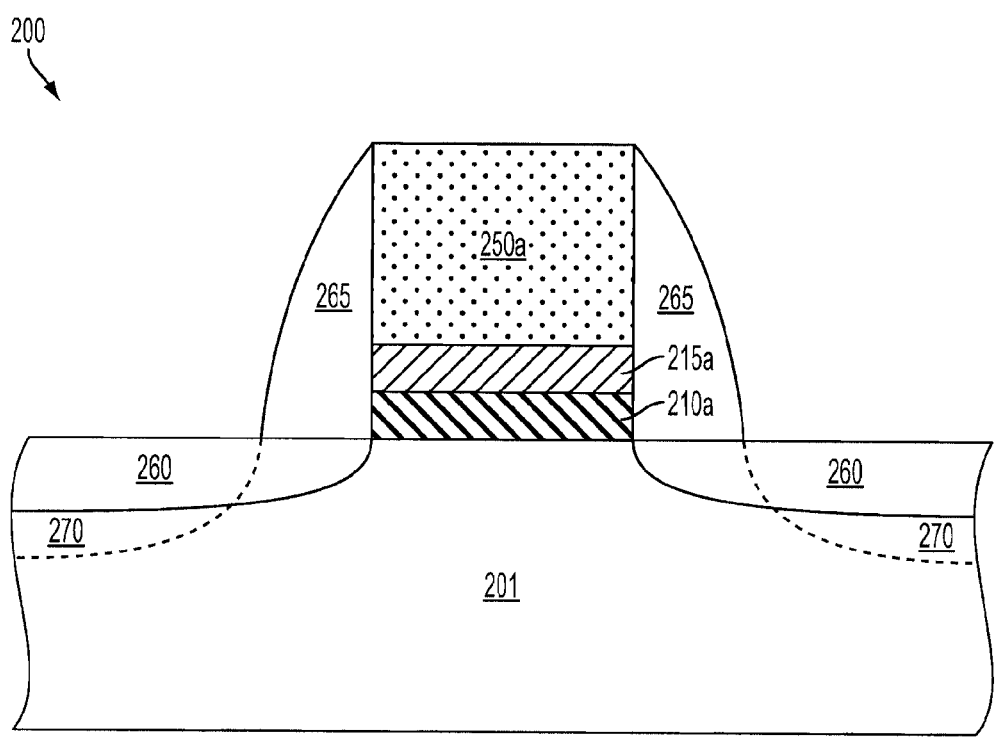

Referring to FIG. 2H, gate spacers 265 can then be formed over the substrate and on each side of the gate stack structure 251 using a deposition process and an etching process (for example, an anisotropic etching process). The gate spacers 265 can include a suitable dielectric material, such as silicon nitride, silicon oxide, silicon carbide, silicon oxy-nitride, or combinations thereof. Thereafter, heavily doped source/drain (S/D) regions 270 can be formed in portions of the substrate 201 on each side of the gate spacers 265. The S/D regions 270 can be formed by an ion implantation process and/or a diffusion process. N-type dopants, such as phosphorus or arsenic, can be used to form an NMOS device, and P-type dopants, such as boron, can be used to form a PMOS device. The S/D regions 270 can be aligned with the gate spacers 265.

After forming the S/D regions 270, an inter-layer (or inter-level) dielectric (ILD) layer (not shown) can be formed over the substrate 201 and the gate stack structure 251. The ILD layer can be formed by chemical vapor deposition (CVD), high density plasma CVD, spin-on, sputtering, or other suitable methods. In some embodiments, the ILD layer can include silicon oxide, e.g., undoped silicate glass (USG), boron-doped silicate glass (BSG), phosphor-doped silicate glass (PSG), boron-phosphor-doped silicate glass (BPSG), or the like, silicon oxy-nitride, silicon nitride, a low-k material, or any combinations thereof.

Although not illustrated, one or more annealing processes are performed on the semiconductor device to activate the S/D regions 270. These annealing processes can have relatively high temperatures (such as temperatures greater than approximately 700 degrees Celsius) and can be performed before or after a chemical-mechanical polish (CMP) process on the ILD layer.

Thus, FIGS. 2A-2H illustrate the various stages of a "gate first" process. Additional processes may be performed to complete the fabrication of the integrated circuit 200, such as the forming of an interconnect structure and other backend structures. For the sake of simplicity, these processes are not illustrated herein.

As described above, it is understood that the gate electrode layer 250a may either be used in a "gate first" process, or the gate electrode layer 250a can be used as a dummy gate electrode in a "gate last" process. For example, if gate electrode 250a shown in FIG. 2H is formed of a polysilicon material, a CMP process could be performed on the ILD layer (not shown) to expose a top surface of the gate stack structure 251. Following the CMP process, the top surface of the gate structure 251 is substantially co-planar with the top surface of the ILD layer on either side of the gate stack structure 251. Afterwards, the gate electrode 250a can be removed, thereby forming a trench in place of the gate electrode 250a. The gate electrode 250a may be removed in a wet etching or a dry etching process, while the other layers of the integrated circuit 200 remain substantially un-etched. Since the polysilicon gate electrode 250a is removed in the gate last process, it is also referred to as a "dummy gate". Finally, a metallic structure can be formed within the trench and over the high-k gate dielectric layer 215a. The metallic structure can include at least one of a metal diffusion layer, a metallic work function layer, a metallic conductive layer, other suitable semiconductor layers, or any combinations thereof.

It is understood that additional processes may be performed to complete the fabrication of the integrated circuit 200. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

Referring again to FIG. 1, in some embodiments, the method 100 can optionally include treating a surface of the substrate with an ozone-containing gas (block 140). For example, before the formation of the silicon oxide gate layer 210 (shown in FIG. 2A), the surface of the substrate 201 is treated with an ozone-containing gas.

In some embodiments, the ozone-containing gas can comprise ozone ($O_3$) and at least one carrier gas, e.g., nitrogen ($N_2$), helium (He), and/or other suitable carrier gases. The ozone can have a weight percentage ranging from about 1.35% to about 15.5%. In some embodiments, treating the surface of the substrate 201 can have a processing time ranging from about 5 seconds to about 80 seconds. In other embodiments, the processing time can range from about 10 seconds to about 30 seconds.

In some embodiments, treating the surface of the substrate 201 can optionally include rotating the substrate 201. In some embodiments, treating the surface of the substrate 201 can include spreading a de-ionized (DI) water layer over the substrate 201. The ozone-containing gas can diffuse through the water layer, such that the ozone-containing gas can reach and treat the surface of the substrate 201. It is noted that though showing the ozone-treatment in block 140, the scope of the present application is not limited thereto. In some embodiments, the ozone treatment can be replaced by, for example, a standard RCA clean, a SPM clean, a standard cleaning 1 (SC1), and/or standard cleaning 2 (SC2) processes.

Referring again to FIG. 1, in some embodiments, the method 100 can optionally include vapor cleaning the surface of the substrate (block 150). For example, before the formation of the silicon oxide gate layer 210 (shown in FIG. 2A), the surface of the substrate 201 can be vapor cleaned. In some embodiments, the vapor cleaning can use a vapor phase fluorine-containing chemical to clean the surface of the substrate 201.

In some embodiments, the vapor phase fluorine-containing chemical can include a passivation mixture including fluorine and an alcohol, such as isopropyl alcohol (IPA), methanol, or ammonia. For example, the passivation mixture may include a hydrous hydrofluoric acid vapor and an IPA vapor supplied by a carrier gas such as nitrogen. In some embodiments, the passivation mixture includes ranging from about 10 wt % to about 80 wt % of hydrous hydrofluoric acid vapor, for example including hydrofluoric acid at about 49 wt %. In other embodiments, the passivation mixture includes hydrofluoric acid vapor and IPA vapor at a weight ratio ranging from around 0.5/1 to around 10/1, for example around 3/1. In still other embodiments, the passivation mixture may include hydrofluoric acid and an alcohol in a vapor phase form of HF and IPA. In yet still other embodiments, the passivation mixture may include hydrofluoric acid and ammonia ($NH_3$). Other carrier gases which are substantially non-reactive with silicon, such as argon, may be suitable.

In some embodiments, the vapor cleaning may occur at between ambient temperature and about 100 degrees Celsius and between atmospheric pressure and about 300 torr, and does not include high temperature implantation, annealing, UV light, or plasma processing, thereby avoiding interface defects that may occur from those processes. In other embodiments, the vapor cleaning may occur at between room temperature and about 100 degrees Celsius and between 1 mtorr and about 10 torr, and then with a baking process from about 50 to about 200 degrees. As noted, the blocks 140 and 150 shown in FIG. 1 are merely optional and exemplary. In some embodiments, the order of the blocks 140 and 150 can be switched.

Figure 4:
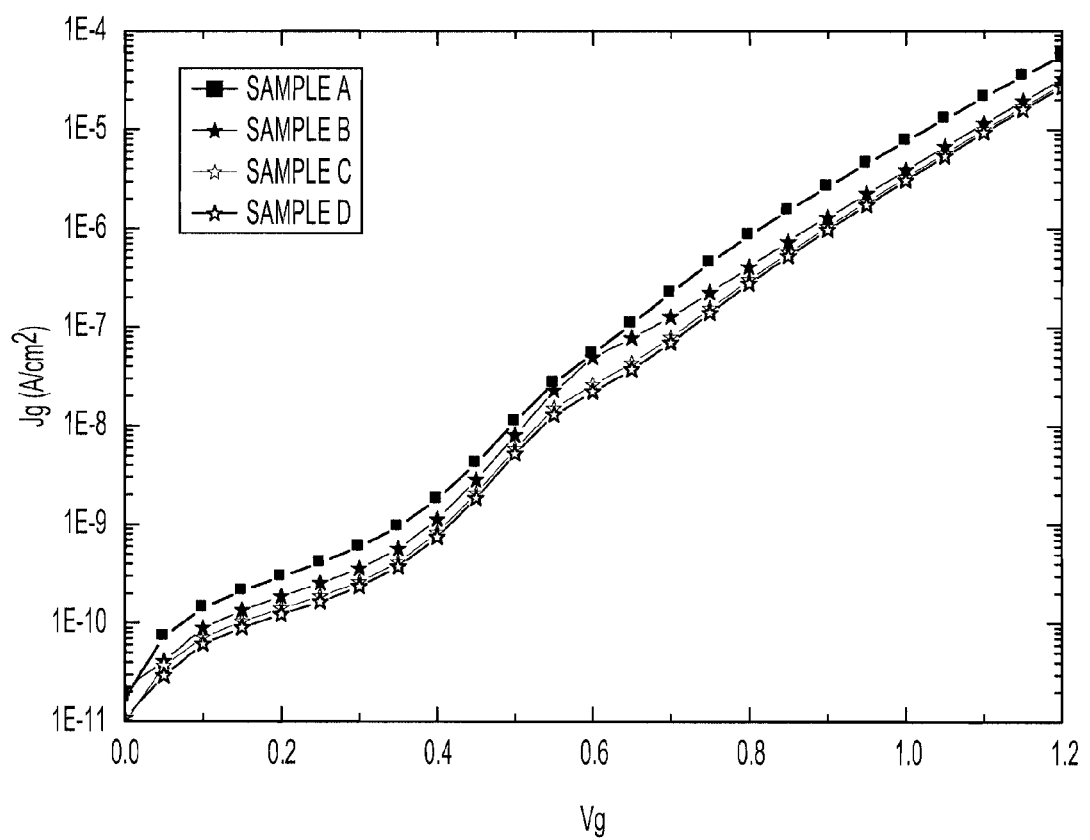
FIG. 4 is a schematic drawing illustrating a $J_g$-$V_g$ (gate leakage current density-gate voltage) relation.

FIG. 4 is a schematic drawing illustrating a $J_g$-$V_g$ (gate leakage current density-gate voltage) relation. In FIG. 4, sample A was prepared by an SC1 process between the formations of the silicon oxide gate layer and the high-k gate dielectric layer. Samples B-D were prepared by the method 100 described above in conjunction with FIG. 1 with different ozone-containing-gas treating time of about 10, 20, and 30 seconds, respectively. It was found that the gate leakage currents of the samples B-D are substantially and unexpectedly lower than that of the sample A as shown in FIG. 4.

FIG. 5 is a table showing capacitance effective thickness (CET), gate leakage current, and uniformities of samples A-D. As shown in FIG. 5, CETs and uniformities of CETs of the samples B-D are substantially similar to those of the sample A. The gate leakage currents of the samples B-D are unexpectedly and substantially reduced by 50.93%, 61.73%, and 63.88%, respectively, compared to that of the sample A. Additionally, the uniformities of the gate leakage currents of the samples B-D are improved compared with that of the sample A.

In a first exemplary embodiment, a method of forming gate dielectric material includes forming a silicon oxide gate layer over a substrate. The silicon oxide gate layer is treated with a first ozone-containing gas. After treating the silicon oxide gate layer, a high dielectric constant (high-k) gate dielectric layer is formed over the treated silicon oxide gate layer.

In a second exemplary embodiment, a method of forming gate dielectric material includes thermally forming a silicon oxide gate layer over a substrate. A first water layer is spread over the silicon oxide gate layer. A first ozone-containing gas is diffused through the first water layer to treat the silicon oxide gate layer. After treating the silicon oxide gate layer, a high dielectric constant (high-k) gate dielectric layer is formed over the treated silicon oxide gate layer.

In a third exemplary embodiment, a method of forming gate dielectric material includes thermally forming a silicon oxide gate layer over a substrate by an enhanced in-situ steam generation (EISSG) process. A first water layer is spread over the silicon oxide gate layer. A first ozone-containing gas is diffused through the first water layer to treat the silicon oxide gate layer. After treating the silicon oxide gate layer, a high dielectric constant (high-k) gate dielectric layer is formed over the substrate by a decoupled plasma nitridization (DPN) process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming gate dielectric material, the method comprising:
   forming a silicon oxide gate layer over a substrate;
   treating the silicon oxide gate layer with a first ozone-containing gas; and
   after treating the silicon oxide gate layer, forming a high dielectric constant (high-k) gate dielectric layer over the treated silicon oxide gate layer,
   wherein said treating the silicon oxide gate layer comprises:
      spreading a first water layer over the silicon oxide gate layer; and
      diffusing the first ozone-containing gas through the first water layer, such that the first ozone-containing gas diffused through the first water layer treats a surface of the silicon oxide gate layer; and wherein said diffusing causes the ozone in the first ozone-containing gas diffused through the first water layer to have a supersaturating concentration.

2. The method of claim 1, wherein forming the silicon oxide gate layer comprises:
thermally forming the silicon oxide gate layer over the substrate at a temperature of about 700° C. or more.

3. The method of claim 1, wherein treating the silicon oxide gate layer further comprises:
rotating the substrate.

4. The method of claim 3, wherein the first ozone-containing gas comprises ozone and at least one carrier gas, and the ozone has a weight percentage ranging from about 1.35% to about 15.5%.

5. The method of claim 3, wherein treating the silicon oxide gate layer with the first ozone-containing gas has a processing time ranging from about 5 seconds to about 80 seconds.

6. The method of claim 1, after forming the high-k gate dielectric layer, further comprising:
nitridizing at least a portion of the silicon oxide gate layer to form a silicon oxynitride layer.

7. The method of claim 1, further comprising:
treating a surface of the substrate with a second ozone-containing gas before forming the silicon oxide gate layer over the surface of the substrate.

8. The method of claim 7, wherein treating the surface of the substrate comprises:
rotating the substrate;
spreading a second water layer over the substrate; and
diffusing the second ozone-containing gas through the second water layer, such that the second ozone-containing gas treats the surface of the substrate.

9. The method of claim 8, wherein the second ozone-containing gas comprises ozone and at least one carrier gas, and the ozone has a weight percentage ranging from about 1.35% to about 15.5%.

10. The method of claim 8, wherein treating the surface of the substrate with the second ozone-containing gas has a processing time ranging from about 5 seconds to about 80 seconds.

11. A method of forming gate dielectric material, the method comprising:
forming a silicon oxide gate layer over a substrate;
spreading a first water layer over the silicon oxide gate layer;
diffusing a first ozone-containing gas through the first water layer to treat the silicon oxide gate layer; and
after treating the silicon oxide gate layer, forming a high dielectric constant (high-k) gate dielectric layer over the treated silicon oxide gate layer.

12. The method of claim 11, wherein the first ozone-containing gas comprises ozone and at least one carrier gas, and the ozone has a weight percentage ranging from about 1.35% to about 15.5%.

13. The method of claim 11, wherein the diffusing causes the ozone in the first ozone-containing gas to have a super-saturating concentration for forming hydroxyl groups on a surface of the silicon oxide gate layer being treated.

14. The method of claim 11, before forming the silicon oxide gate layer, further comprising:
rotating the substrate;
spreading a second water layer over the substrate; and
diffusing a second ozone-containing gas through the second water layer, such that the second ozone-containing gas treats a surface of the substrate.

15. The method of claim 14, wherein the second ozone-containing gas comprises ozone and at least one carrier gas, and the ozone has a weight percentage ranging from about 1.35% to about 15.5%.

16. A method of forming gate dielectric material, the method comprising:
thermally forming a silicon oxide gate layer over a substrate by an enhanced in-situ steam generation (EISSG) process;
spreading a first water layer over the silicon oxide gate layer;
diffusing a first ozone-containing gas through the first water layer to treat the silicon oxide gate layer;
after treating the silicon oxide gate layer, forming a high dielectric constant (high-k) gate dielectric layer over the treated silicon oxide gate layer; and
nitridizing at least a portion of the silicon oxide gate layer to form a silicon oxynitride layer by a decoupled plasma nitridization (DPN) process.

17. The method of claim 16, wherein the first ozone-containing gas comprises ozone and at least one carrier gas, and the ozone has a weight percentage ranging from about 1.35% to about 15.5%.

18. The method of claim 17, wherein treating the silicon oxide gate layer with the first ozone-containing gas has a processing time ranging from about 5 seconds to about 80 seconds.

19. The method of claim 16, before thermally forming the silicon oxide gate layer, further comprising:
rotating the substrate;
spreading a second water layer over the substrate; and
diffusing a second ozone-containing gas through the second water layer, such that the second ozone-containing gas treats a surface of the substrate over which the silicon oxide gate layer is subsequently thermally formed.

20. The method of claim 19, wherein the second ozone-containing gas comprises ozone and at least one carrier gas, and the ozone has a weight percentage ranging from about 1.35% to about 15.5%.

21. The method of claim 11, wherein treating the silicon oxide gate layer with the first ozone-containing gas forms hydroxyl groups on a surface of the silicon oxide gate layer being treated, the high-k gate dielectric layer being subsequently formed over the surface with the hydroxyl groups of the treated silicon oxide gate layer.

* * * * *